(12) United States Patent
Bawendi et al.

(10) Patent No.: US 7,690,842 B2
(45) Date of Patent: *Apr. 6, 2010

(54) COMPOSITE MATERIAL INCLUDING NANOCRYSTALS AND METHODS OF MAKING

(75) Inventors: Moungi G. Bawendi, Cambridge, MA (US); Vikram C. Sundar, New York, NY (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/955,224

(22) Filed: Dec. 12, 2007

(65) Prior Publication Data
US 2008/0090385 A1    Apr. 17, 2008

Related U.S. Application Data

(63) Continuation of application No. 11/129,329, filed on May 16, 2005, now Pat. No. 7,326,365, which is a continuation of application No. 09/779,437, filed on Feb. 9, 2001, now abandoned.

(51) Int. Cl.
*G01K 11/00* (2006.01)
*C09K 11/00* (2006.01)

(52) U.S. Cl. .............................. 374/161; 252/301.4 R; 252/301.6 S; 252/301.6 R; 252/301.4 S; 977/813; 977/778

(58) Field of Classification Search ................. 374/161
See application file for complete search history.

(56) References Cited

U.S. PATENT DOCUMENTS

| 4,075,493 | A | 2/1978 | Wickersheim |
| 4,105,808 | A | 8/1978 | McKenzie |
| 4,374,328 | A | 2/1983 | Tekippe et al. |
| 4,417,008 | A | 11/1983 | Salensky et al. |
| 4,427,835 | A | 1/1984 | Bush et al. |
| 4,448,547 | A | 5/1984 | Wickersheim |
| 4,652,143 | A | 3/1987 | Wickersheim et al. |

(Continued)

FOREIGN PATENT DOCUMENTS

DE    3803336    8/1989

(Continued)

OTHER PUBLICATIONS

Alivisatos, "Perspectives on the Physical Chemistry of Semiconductor Nanocrystals", *J. Phys. Chem.*, vol. 100, No. 31, pp. 13226-13239, (1996).

(Continued)

*Primary Examiner*—Gail Verbitsky
*Assistant Examiner*—Mirellys Jagan
(74) *Attorney, Agent, or Firm*—Steptoe & Johnson LLP

(57) ABSTRACT

Temperature-sensing compositions can include an inorganic material, such as a semiconductor nanocrystal. The nanocrystal can be a dependable and accurate indicator of temperature. The intensity of emission of the nanocrystal varies with temperature and can be highly sensitive to surface temperature. The nanocrystals can be processed with a binder to form a matrix, which can be varied by altering the chemical nature of the surface of the nanocrystal. A nanocrystal with a compatibilizing outer layer can be incorporated into a coating formulation and retain its temperature sensitive emissive properties.

15 Claims, 2 Drawing Sheets

U.S. PATENT DOCUMENTS

| | | | |
|---|---|---|---|
| 4,776,827 | A | 10/1988 | Greaves |
| 4,789,992 | A | 12/1988 | Wickersheim et al. |
| 4,819,658 | A | 4/1989 | Kolodner |
| 4,896,325 | A | 1/1990 | Coldren |
| 5,008,136 | A | 4/1991 | Chamberlain |
| 5,035,513 | A | 7/1991 | Fehrenbach et al. |
| 5,036,194 | A | 7/1991 | Hazel |
| 5,186,046 | A | 2/1993 | Gouterman et al. |
| 5,213,985 | A | 5/1993 | Sandroff et al. |
| 5,233,020 | A | 8/1993 | Hase et al. |
| 5,253,258 | A | 10/1993 | Lawandy |
| 5,260,957 | A | 11/1993 | Hakimi et al. |
| 5,262,357 | A | 11/1993 | Alivisatos et al. |
| 5,293,050 | A | 3/1994 | Chapple-Sokol et al. |
| 5,308,804 | A | 5/1994 | Lee |
| 5,341,676 | A | 8/1994 | Gouterman et al. |
| 5,354,707 | A | 10/1994 | Chapple-Sokol et al. |
| 5,359,887 | A | 11/1994 | Schwab et al. |
| 5,395,791 | A | 3/1995 | Cheng et al. |
| 5,422,489 | A | 6/1995 | Bhargava |
| 5,434,878 | A | 7/1995 | Lawandy |
| 5,491,114 | A | 2/1996 | Goldstein |
| 5,492,080 | A | 2/1996 | Ohkawa et al. |
| 5,499,260 | A | 3/1996 | Takahashi et al. |
| 5,505,928 | A | 4/1996 | Alivisatos et al. |
| 5,515,393 | A | 5/1996 | Okuyama et al. |
| 5,525,377 | A | 6/1996 | Gallagher et al. |
| 5,537,000 | A | 7/1996 | Alivisatos |
| 5,541,948 | A | 7/1996 | Krupke et al. |
| 5,585,640 | A | 12/1996 | Huston et al. |
| 5,606,163 | A | 2/1997 | Huston et al. |
| 5,612,492 | A | 3/1997 | Schwab et al. |
| 5,625,456 | A | 4/1997 | Lawandy |
| 5,674,698 | A | 10/1997 | Zarling et al. |
| 5,711,803 | A | 1/1998 | Pehnt et al. |
| 5,721,099 | A | 2/1998 | Still et al. |
| 5,730,528 | A | 3/1998 | Allison et al. |
| 5,736,330 | A | 4/1998 | Fulton |
| 5,747,180 | A | 5/1998 | Miller et al. |
| 5,751,018 | A | 5/1998 | Alivisatos et al. |
| 5,770,299 | A | 6/1998 | Dannenhauer et al. |
| 5,881,200 | A | 3/1999 | Burt |
| 5,965,642 | A | 10/1999 | Gouterman et al. |
| 5,985,353 | A | 11/1999 | Lawton et al. |
| 5,986,272 | A | 11/1999 | Britton, Jr. et al. |
| 5,990,479 | A | 11/1999 | Weiss et al. |
| 6,123,455 | A | 9/2000 | Beshears et al. |
| 6,207,229 | B1 | 3/2001 | Bawendi et al. |
| 6,236,060 | B1 | 5/2001 | Chan et al. |
| 6,251,303 | B1 | 6/2001 | Bawendi et al. |
| 6,274,323 | B1 | 8/2001 | Bruchez et al. |
| 6,287,377 | B1 | 9/2001 | Binns et al. |
| 6,319,607 | B1 | 11/2001 | Barberra-Guillem et al. |
| 6,322,901 | B1 | 11/2001 | Bawendi et al. |
| 6,337,117 | B1 | 1/2002 | Maenosono et al. |
| 6,501,091 | B1 | 12/2002 | Bawendi et al. |
| 6,506,342 | B1 | 1/2003 | Frankel |
| 6,512,172 | B1 | 1/2003 | Salafsky et al. |
| 6,525,111 | B1 | 2/2003 | Spencer et al. |
| 6,548,168 | B1 | 4/2003 | Mulvaney et al. |
| 6,548,171 | B1 | 4/2003 | Barbera-Guillem et al. |
| 6,576,155 | B1 | 6/2003 | Barbera-Guillem et al. |
| 6,611,640 | B2 | 8/2003 | LoCasclo et al. |
| 6,617,583 | B1 | 9/2003 | Bawendi et al. |
| 6,690,871 | B2 | 2/2004 | Lee et al. |
| 6,710,366 | B1 | 3/2004 | Lee et al. |
| 6,803,719 | B1 | 10/2004 | Miller et al. |
| 6,869,864 | B2 | 3/2005 | Yim et al. |
| 6,890,777 | B2 | 5/2005 | Bawendi et al. |
| 6,914,265 | B2 | 7/2005 | Bawendi et al. |
| 2001/0038900 | A1 | 11/2001 | Todori et al. |
| 2002/0006153 | A1 | 1/2002 | Ranson et al. |
| 2002/0110180 | A1 | 8/2002 | Barney et al. |
| 2003/0142944 | A1 | 7/2003 | Sundar et al. |
| 2004/0217298 | A1 | 11/2004 | Bawendi et al. |
| 2004/0259363 | A1 | 12/2004 | Bawendi et al. |

FOREIGN PATENT DOCUMENTS

| | | |
|---|---|---|
| GB | 2283752 | 5/1995 |
| JP | 01 176095 | 7/1989 |
| JP | 2001004460 | 1/2001 |
| WO | WO 98/04740 | 2/1998 |
| WO | WO 98/19963 | 5/1998 |
| WO | WO 98/33070 | 7/1998 |
| WO | WO 98/36376 | 8/1998 |
| WO | WO 99/19515 | 4/1999 |
| WO | WO 99/26299 | 6/1999 |
| WO | WO 99/50916 | 10/1999 |
| WO | WO 00/17655 | 3/2000 |
| WO | WO 00/27365 | 5/2000 |
| WO | WO 00/28088 | 5/2000 |
| WO | WO 01/07689 | 2/2001 |
| WO | WO 01/31374 | 5/2001 |
| WO | WO 01/71867 | 9/2001 |

OTHER PUBLICATIONS

Alivisatos, "Semiconductor Clusters, Nanocrystals, & Quantum Dots," *Science*, 271, pp. 933-937, (1996).

Allison and Gillies, "Remote Thermometry with therographic phosphors: Instrumentation and applications," Rev. Sci. Instrum., vol. 68, No. 7, pp. 2616-2650, Jul. 1997.

Allison et al., "A Survey of Thermally Sensitive Phosphors for Pressure Sensitive Paint Applications," Oak Ridge National Laboratory, May 2000.

Allison et al., "Development of Temperature-Sensitive Paints for High Temperature Aeropropulsion Applications", 37th AIAA/ASME/SAE/ASEE Joint Propulsion Conference and Exhibit, Jul. 8-11, 2001.

Allison et al., "High Temperature Surface Measurements Using Lifetime Imaging of Thermographic Phosphors: Bonding Tests", Instrumentation in Aerospace Simulation Facilities, ICIASF Aug. 27-30, 2001, pp. 171-176.

Allison et al., "Sub-Microsecond Decay Time Phosphors for Pressure Sensitive Paint Applications," Oak Ridge National Laboratory, May 2001.

Arakawa et al., "Multidimensional quantum well laser and temperature dependence of its threshold current," *Appl. Phys. Lett.* 1982, 40, 939-941.

Asada et al., "Gain and the Threshold of Three-Dimensional Quantum-Box Lasers," *IEEE J. Quant. Electron.* 1986, 22, 1912.

Banaszak et al., "An Optical Technique for Detecting Fatigue Cracks in Aerospace Structures" Instrumentation in Aerospace Simulation Facilities, ICIASF Jun. 14-17, 1999, pp. 271/1-27/7.

Bawendi, et al,. "Luminescence properties of CdSe quantum crystallites: Resonance between interior and surface localized states", *J. Chem. Phys.*, 96(2), pp. 946-954, (Jan. 1, 1992).

Bruchez et al., "Semiconductor Nanocrystals as Fluorescent Biological Labels," *Science* 1998, 281, 2013.

Bruchez et al., "Semiconductor nanocrystals as fluorescent probes for biology," *Cytometry*, Supplement 9, p. 26, (Mar. 1998).

Butty et al., "Quasicontinuous gain in sol-gel derived CdS quantum dots," *Appl. Phys. Lett.* 1995, 67, 2672-2674.

Carroll et al., "Pressure and Temperature Measurements With a Dual-Luminophor Coating", Instrumentation in Aerospace Simulation Facilities, ICIASF Jun. 14-17, 1999, pp. 18/1-18/8.

Chan et al., "Quantum Dot Bioconjugates for Ultrasensitive Nonisotopic Detection," *Science* 1998, 281, 2016-2018.

Colvin et al., "Light-emitting diodes made from cadmium selenide nanocrystals and a semiconducting polymer" *Nature*, 370(6488):354-357, (Aug. 4, 1994).

Correa-Duarte et al., "Stabilization of CdS semiconductor nanoparticles against photodegradation by a silica coating procedure," Chemical Physics Letters, 286, pp. 497-501 (1998).

Dabbousi et al., "(CdSe)ZnS Core-Shell Quantum Dots: Synthesis and Characterization of a Size Series of Highly Luminescent Nanocrystallites," The Journal of Physical Chemistry B, 101(46), pp. 9463-9475 (1997).

Dabbousi et al., "Electroluminescence from CdSe quantum-dot/polymer composites," Appl. Phys. Lett., 66 (11), pp. 1316-1318, (1995).

Danek et al., "Synthesis of Luminescent Thin-film CdSeZnSe Quantum Dot Composites Using CdSe Quantum Dots Passivity with an Over layer of ZnS," Chem. Mater., 8(1), pp. 173-180, (1996).

Efros, A.L., et al., "Resonance Raman Spectroscopy of Electron-Hole Pairs—Polar Phonon Coupling in Semiconductor Quantum Microcrystals," *Solid State Communications*, vol. 78, No. 10, pp. 853-856, 1991.

Ekimov, A. I., et al., "Absorportion and intensity-dependent photoluminescence measurements on CdSe quantum dots: assignment of the first electronic transitions," *Journal of the Optical Society of America*, vol. 10, Nos. 1-12, 100-107 (1992).

Ekimov, A., et al., "Growth of CdSe nanocrystals in ion-implanted $SiO_2$ films," *Journal of Crystal Growth* 151 (1995) 38-45.

Ekimov, A.I., "Growth and optical properties of semiconductor nanocrystals in a glass matrix," *Journal of Luminescence* 70 (1996) 1-20.

Ekimov, A.I., "Optical Properties of Oxide Glasses Doped by Semiconductor Nanocrystals," *Radiation Effects and Defects in Solids*, 1995, vol. 134, pp. 11-22.

Ekimov, A.I., "Optical Properties of Semiconductor Quantum Dots in Glass Matrix," *Physica Scripta*. vol. T39, 217-222 (1991).

Ekimov, A.I., et al. "Dimensional Effects in Luminescence Spectra of Zero-Dimensional Semiconductor Structures," *Bulletin of the Russian Academy of Sciences*, vol. 56, No. 2, pp. 154-157, Feb. 1992.

Ekimov, A.I., et al., "Spectra and Decay Kinetics of Radiative Recombination in CdS Microcrystals," *Journal of Luminescence* 46 (1990) 83-95 North-Holland.

Ekimov, A.I., et al., "Donor-like Exciton in Zero-Dimension Semiconductor Structures," *Solid State Communications*, vol. 69, No. 5, pp. 565-568, 1989.

Ekimov, A.I., et al., "Influence of high hydrostatic pressures on the exciton spectrum of CdS microcrystals in glass," *Sov. Phys. Semicond.* 23(9), Sep. 1989, pp. 965-966.

Ekimov, A.I., et al., "Nonlinear Optics of Semiconductor-Doped Glasses," *Phys. Stat. Sol.* (b) 150, (1988) pp. 627-633.

Ekimov, A.I., et al., "Optics of Zero Dimensional Semiconductor Systems, *Acta Physica Polonica A*," vol. 79 (1991), No. 1. pp. 5-14.

Ekimov, A.I., et al., "Photoluminescence of quasizero-dimensional semiconductor structures," *Sov. Phys. Solid State* 31(8), Aug. 1989, pp. 1385-1393.

Ekimov, A.I., et al., "Quantization of the energy spectrum of holes in the adiabatic potential of the electron," *JETP Lett.*, vol. 43, No. 6, Mar. 25, 1986, pp. 376-379.

Ekimov, A.I., et al., "Quantum Size Effect in Semiconductor Microcrystals," *Solid State Communications*, vol. 56, No. 11, pp. 921-924, 1985.

Ekimov, A.I., et al., "Quantum size effect in the optical spectra of semiconductor microcrystals," *Sov. Phys. Semicond.* 16(7), Jul. 1982, pp. 775-778.

Ekimov, A.I., et al., "Quantum size effect in three-dimensional microscopic semiconductor crystals," *JETP Lett*, vol. 34, No. 6, Sep. 20, 1981, pp. 345-349.

Ekimov, A.I., et al., "Quantum-Size Stark Effect in Semiconductor Microcrystals," *Journal of Luminescence* 46 (1990) 97-100 North-Holland.

Ekimov, A.I., et al., "Size quantization of the electron energy spectrum in a microscopic semiconductor crystal," *JETP Lett.*, vol. 40, No. 8, Oct. 25, 1984, pp. 1136-1139.

Empedocles, et al., "Photoluminescence Spectroscopy of Single CdSe Nanocrystalline Quantum Dots", Physical Review Letters, vol. 77, No. 18, pp. 3873-3876, (1996).

Empedocles, et al., Quantum-Confined Stark Effect in single CdSe Nanocrystallite Quantum Dots:, Science, vol. 278, pp. 2114-2117, (1997).

Gallery et al., "Luminescent thermometry for aerodynamic measurements," Rev. Sci. Instrum. 65 (3), pp. 712-720, Mar. 1994.

Gan, et al., "Enhanced Photoluminescence and Characterization of Mn-Doped ZnS Nanocrystallites Synthesized in Microemulsion", Langmuir, vol. 13, No. 24, pp. 6427-6431, (1997).

Gao et al., "Strongly Photoluminescent CdTe Nanocrystals by Proper Surface Modification," J. Phys. Chem., vol. 102, pp. 8360-8363, (1998).

Giessen et al., "Ultrafast Nonlinear Gain Dynamics in Semiconductor Nanocrystals," *Phase Transitions* 1999, vol. 68, 59-94.

Gindele, et al., "Optical gain and high quantum efficiency of matrix-free, closely packed CdSe quantum dots", Appl. Phys. Lett., 71(15), pp. 2181-2183, (Oct. 13, 1997.

Gouterman. "Oxygen Quenching of Luminescence of Pressure Sensitive Paint for Wind Tunnel Research", Journal of Chemical Education, vol. 74, No. 6, pp. 697-702, Jun. 1997.

Green, et al., "Recent advances in the preparation of semiconductors as isolated nanometric particles; new routes to quantum dots", Chem. Commun., pp. 2235-2241, (1999).

Guha et al., "Hybrid organic-inorganic semiconductor-based light-emitting diodes" J. Appl. Phys., 82(8), pp. 4126-4128,( Oct. 15, 1997).

Hines et al., "Synthesis and Characterization of Strongly Luminescing ZnS-Capped CdSe Nanocrystals," J. Phys. Chem. 100, pp. 468-471 (1996).

Imhof et al., "Ordered macroporous materials by emulsion templating," *Nature* 1997, vol. 389, 948-951.

Jarvis, Jr. et al., "Solution Synthesis and Photoluminescence Studies of SMA Crystallites of Cadmium Telluride," *Mat. Res. Soc. Symp. Proc.* 272, pp. 227-234 (1992).

Kagan et al., "Electronic Energy Transfer in CdSe Quantum Dot Solids," Physical Review Letters, 76, pp. 1517-1520, (Feb. 26, 1996).

Kagan et al., "Long-range resonance transfer of electronic excitations in close-packed CdSe quantum-dot solids," Physical Review Letters, 54, pp. 8633-8643, (Sep. 15, 1996).

Klimov, et al., "Quantization of Multiparticle Auger Rates in Semiconductor Quantum Dots", Science, vol. 287, pp. 1011-1013, (Feb. 11, 2000).

Klimov, et al., "Ultrafast dynamics of inter- and intraband transitions in semiconductor nanocrystals: Implications for quantum-dot lasers", Physical Review B, vol. 60, No. 4, pp. 2177-2180, (Jul. 15, 1999).

Kortan et al., "Nucleation and Growth of CdSe on ZnS Quantum Crystallite Seeds, and Vice Versa, In Inverse Micelle Media" J. Am. Chem. Soc. 112:1327-1332, 1990.

Kuno, et al., "The band edge luminescence of surface modified DcSe nanocrystallites: Probing the luminescing state", J. Chem. Phys. 106(23), pp. 9869-9882, (Jun. 15, 1997).

Lawless, "Bifunctional Capping of CdS Nanoparticles & Bridging to $TiO_2$," *J. Phys. Chem.* 1995, 99, 10329-10335.

Leatherdale, et al., "Photoconductivity in CdSe quantum dot solids", vol. 62, No. 4, pp. 2669-2680, (Jul. 15, 2000).

Lee et al. "Full Color Emission from II-VI Semiconductor Quantum Dot-Polymer Composites," Adv. Mater. 12(15):1102-1105, 2000.

Lee et al., "Surface Derivatization of Nanocrystalline CdSe Semiconductors," Mat. Res. Soc. Symp. Proc. 452, pp. 323-328, (1997).

Lett, D. N., "Color-Coding Quantum Dots Debut With Promising Careers In Clinical Diagnostics Field", BioWorld Today, vol. 9, No. 185, p. 1, (1998).

Liz-Marzán, et al., "Synthesis of Nanosized Gold-Silica Core-Shell Particles," Langmuir 12, pp. 4329-4335, (1996).

Ludolph et at., "Novel single molecule precursor routes for the direct synthesis of highly monodispersed quantum dots of cadmium or zinc sulfide or selenide", Chem. Commun., pp. 1849-1850, (1998).

Malik, et al., "Semiconductor Nanoparticles: Their Properties, Synthesis, & Potential for Application," *South African Journal of Science*, 96, pp. 55-60. (2000).

Malyarevich, A. M. et al, "Nonlinear optical properties of $Cu_xS$ and $CulS_2$ nanoparticles in sol-gel glasses," Journal of Applied Physics, vol. 87, No. 1, pp. 212-216, (2000).

Mattoussi et al., "Self-Assembly of CdSe—ZnS Quantum Dot Bioconjugates Using an Engineered Recombinant Protein," *J. Am. Chem. Soc.* 2000, 122, 12142.

Michael, et al., "Randomly Ordered Addressable High-Density Optical Sensor Arrays", Analytical Chemistry, vol. 70, No. 7, pp. 1242-1248, (Apr. 7, 1998).

Mikulec et al., "Synthesis and Characterization of Highly Luminescent (CdSe)ZnS Quantum Dots," Materials Research Society Symposium, 452, pp. 359-364, (1997).

Müllenborn et al., "Characterization of Solution-Synthesized CdTe and HgTe," Applied Physics, 56, pp. 317-321, (1993).

Murray et al., "Synthesis and Characterization of Nearly Monodisperse CdE (E=S, Se, Te) Semiconductor Nanocrystallites", J. Am. Chem. Soc., vol. 115, No. 9, pp. 8706-8715, (1993).

Nirmal et al., "Fluorescence intermittency in single cadmium selenide nanocrystals", Nature, vol. 383, pp. 802-804, (Oct. 31, 1996).

Nozik et al., "Colloidal Quantum Dots of III-V Semiconductors," MRS Bulletin, 23(2), pp. 24-30 (1998).

Pehnt et al., "Nanoparticle Precursor Route to Low-Temperature Spray Deposition of CdTe Thin Films," Appl. Phys. Lett., 67(15), pp. 2176-2178, (Oct. 9, 1995).

Peng, et al., "Epitaxial Growth of Highly Luminescent CdSe/CdS Core/Shell Nanocrystals with Photostability and Electronic Accessibility," J. Am. Chem. Soc., 119, pp. 7019-7029, (1997).

Popernack et al., "Application of Temperature Sensitive Paint for Detection of Boundary Layer Tansition", Instrumentation in Aerospace Simulation Facilities, ICIASF 1997, pp. 77-83.

Righini, Giancarlo C. et al., "Sol-gel glasses for nonlinear optics," Pure Appl. Opt., vol. 5, pp. 655-666, (1996).

Rogach et al., "Synthesis and characterization of Thiol-Stabilized CdTe Nanocrystals" Ber. Bunsenges. Phys. Chem., 100 (11), pp. 1772-2778, (1996).

Schanze et al., "Temperature Dependence of Pressure Sensitive Paints," AIAA Journal, vol. 35, No. 2, pp. 306-309, Feb. 1997.

Spanhel et al., "Photochemistry of Colloidal Semiconductors. Surface Modification and Stability of Strong Luminescing CdS Particles", J. Am. Chem. Soc., 109 (19), pp. 5649-5655, (1987).

Takada et al. "Control of particle size distribution of CdS quantum dots in gel matrix." Journal of Sol-Gel Science and Technology 1:123-132, 1994.

Aktsipetrov, O.A., et al. "Generation of reflected second harmonic at semiconductor quantum dots," JETP Letters, vol. 55, No. 8, 435-439 (1992).

Baltrameyunas, R., et al., "Fast switching of the transmission of light by glasses activated with CdS microcrystals," Sov. Phys. Semicond., vol. 25 No. 2, 164-166 (1991).

Baltramiejunas, R., et al., "Rapid Process of Darkening and Bleaching in CdS Dopes Glasses," Superlattices and Microstructures vol. 10, No. 3, 307-310 (1990).

Bhargava, R.N., et al., "Quantum Confined Atoms of Doped ZnO Nanocrystals", Phys. Stat. Sol. (b) 229, No. 2, 897-901 (2002).

Chamarro, M., et al., "Enhancement of electron-hole exchange interaction in CdSe nanocrystals; A quantum confinement effect," Physical Review B, Vol. 53, No. 3, 15 January 1996-1, 1336-1342.

Chamarro, M., et al., "Enhancement of Exciton Exchange Interaction by Quantum Confinement in CdSe Nanocrystals," Jpn. J. Appl. Phys, vol. 34, 12-14 (1994).

Chamarro, M., et al., "Size-dependent Electron-Hole Exchange Interaction in CdSe Quantum Dots, Il Nuovo Cimento," vol. 17, Nos. 11-12, (1995) 1407-1412.

Chepic, D.I., et al., "Auger ionization of semiconductor quantum drops in a glass matrix," Journal of Luminescence 47 (1990) 113-127 North-Holland.

Dneproviskii, V.S., et al., "Time-Resolved Luminescence of CdSe Microcrystals," Solid State Communications, vol. 74, No. 7, pp. 555-557, 1990.

Edamatsu, K., et al., "Subpicosecond dynamics of confined excitons and optical nonlinearities of CuCl quantum dots," Journal of Luminescence 66 & 67 (1996) 406-409.

Grabovskis, V.Y., et al., "Photoionization of semiconducting microcrystals in glass," Sov. Phys. Solid State 31(1), Jan. 1989, pp. 149-151.

Gurevich, S.A., et al. "Preparation and investigation of $SiO_2$ films activated by CdS semiconductor nanocrystals," Soviet Physics Semiconductors, vol. 26, 57-59 (1992).

Gurevich, S.A., et al., "Growth of CdS nanocrystals in silicate glasses and in thin $SiO_2$ films in the Initial states of the phase separation of a solid solution," Semiconductors, 28 (5), May 1994, 486493.

Itoh, T. et al., "Interface effects on the properties of confined excitons in CuCl microcrystals," Journal of Luminescence 60 & 61 (1994) 396-399.

Itoh, T., et al., "Polaron and Exciton-Phonon Complexes in CuCl Nanocrystals," Physical Review Letters, vol. 74, No. 9, Feb. 27, 1995, p. 1645-1648.

Itoh, T. et al., "Subpicosecond dynamics of confined excitons in CuCl nanocrystals," Materials Science and Engineering A217/218 (1996) 167-170.

Jursenas, S., et al., "Surface Recombination of Nonequilibrium Electron-Hole Plasma in LaserModified Semiconductor-Doped Glasses," Solid State Communications, vol. 87, No. 6, 577-580 (1993).

Lublinskaya, O., et al., "CdS nanocrystal growth in thin silica films: evolution of size distribution function", Journal of Crystal Growth 184/185 (1998) 360-364.

Saviot, L., et al., "Effects of Resonance on Low-Frequency Raman Scattering From Semiconductor Nanocrystals," Radiation Effects and Defects in Solids, 1995, vol. 137, pp-45-50.

Saviot, L., et al., "Size dependence of acoustic and optical vibrational modes of CdSe nanocrystals in glasses," Journal of Non-Crystalline Solids 197 (1996) 238-246.

Saviot, L., et al., "Size-selective resonant Raman scattering in CdS doped glasses," Physical Review B, vol. 57, No. 1, Jan. 1, 1998-I, 341-346.

Sirenko, A.A., et al., "Spin-flip and acoustic-phonon Raman scattering in CdS nanocrystals", Physical Review B, vol. 58, No. 4, 15 (Jul. 1998-II), 2077-2087.

Tamulaitis, G., et al., "Dynamics of Nonlinear Optical Response of CuBr-Doped Glasses," Superlattices and Microstructures, vol. 3, No. 2, 199-202 (1993).

Valenta, J., et al., "Dynamics of excitons in CuBr nanocrystals: Spectral-hole burning and transient four-wave-mixing measurements," Physical Review B, vol. 57, No. 3, Jan. 15, 1998-I, 1774-1783.

Vandyshev, Y.V., et al., "Nonlinear optical properties of semiconductor microcrystals," JETP Lett., vol. 46, No. 10, Nov. 25, 1987 pp. 435-439.

Volkov, A.S., et al., "Oscillations of polarization of recombination radiation of a variable gap semiconductor in a magnetic field," JETP Lett., vol. 25 No. 55, 526-528 (1977).

COMPOSITE MATERIAL INCLUDING NANOCRYSTALS AND METHODS OF MAKING

CROSS REFERENCE TO RELATED APPLICATIONS

This application is a continuation of U.S. patent application Ser. No. 11/129,329, filed May 16, 2005, now U.S. Pat. No. 7,326,365 which is a continuation of U.S. patent application Ser. No. 09/779,437, filed Feb. 9, 2001, now abandoned, each of which is incorporated by reference in their entirety.

FEDERALLY SPONSORED RESEARCH OR DEVELOPMENT

This invention was made with government support under Grant No. DE-FG02-02ER45974, awarded by the Department of Energy, and Grant No. DMR-0213282, awarded by the National Science Foundation. The government has certain rights in the invention.

TECHNICAL FIELD

This invention relates to a temperature-sensing composition.

BACKGROUND

Specialty compositions, which can contain luminescent probes that are sensitive to environmental parameters such as, for example, temperature and pressure, have a variety of analytical applications. For example, specialty compositions can form coatings used to remotely determine the surface temperature of an object in a non-invasive manner.

Objects can be coated with films containing the sensing compositions which emit light of varying intensities, depending on temperature and oxygen pressure. In a specific example, temperature-sensing compositions can be used in combination with compositions for measuring the pressure of an oxygen-containing gas on an aerodynamic surface by oxygen-quenching of luminescent pressure sensing compositions. These compositions can be used to provide convenient and inexpensive methods for determining pressure or temperature maps at surfaces. An example of a pressure-sensing composition includes a phosphorescent porphyrin which has an emission that is quenched by oxygen. This quenching can be used to quantitatively measure the static pressure on the surface of the object. In certain circumstances, the emission of the pressure-sensing composition can have temperature dependence in addition to pressure dependence. Accordingly, pressure measurements containing a temperature-sensing composition can be corrected by sensing fluctuations in the temperature in addition to pressure.

SUMMARY

Temperature-sensing compositions can include an inorganic material, such as a semiconductor nanocrystal. The nanocrystal can be a dependable and accurate indicator of temperature. The intensity of emission of the nanocrystal varies with temperature and can be highly sensitive to surface temperature. The nanocrystals can be processed with a binder to form a matrix, which can be varied by altering the chemical nature of the surface of the nanocrystal. A nanocrystal with a compatibilizing outer layer can be incorporated into a coating formulation and retain its temperature sensitive emissive properties.

In one aspect, a method of sensing temperature includes providing a temperature sensor including a matrix on a surface of a substrate, the matrix comprising a semiconductor nanocrystal in a binder, irradiating a portion of the sensor with an excitation wavelength of light, detecting emission of light from the sensor, and determining the temperature from the emission of light from the sensor.

In another aspect, a temperature sensor includes a matrix containing a semiconductor nanocrystal. The matrix can be formed from a semiconductor nanocrystal and a binder.

In another aspect, a temperature-sensing coating includes a matrix on a surface of a substrate. The matrix can include a semiconductor nanocrystal in a binder.

In another aspect, a temperature-sensing paint includes a semiconductor nanocrystal in a binder and a deposition solvent. The semiconductor nanocrystal can emit light independent of oxygen pressure and dependent upon temperature upon irradiation by an excitation wavelength of light. The emission intensity can change by 1.1-1.6% per degree centigrade. The paint can include a pressure-sensitive composition, the pressure-sensitive composition emitting light dependent upon oxygen pressure upon irradiation by an excitation wavelength of light. The pressure-sensitive composition can include a porphyrin, such as a platinum porphyrin. The deposition solvent can include an alcohol.

In another aspect, a method of manufacturing a temperature-sensing paint includes combining a semiconductor nanocrystal, a binder, and a deposition solvent to form a paint. The paint can be used to manufacture a temperature sensor by depositing a temperature-sensing paint on a surface of a substrate.

The semiconductor nanocrystal can include a group II-VI semiconductor, a group III-V semiconductor, or group IV semiconductor, for example, ZnS, ZnSe, ZnTe, CdS, CdSe, CdTe, HgS, HgSe, HgTe, AlN, AlP, AlAs, AlSb, GaN, GaP, GaAs, GaSb, InN, InP, InAs, InSb, TlN, TlP, TlAs, TlSb, PbS, PbSe, PbTe, or mixtures thereof. The semiconductor nanocrystal can be overcoated with a second semiconductor material. The semiconductor nanocrystal can include an organic or organometallic overlayer, the overlayer making the nanocrystal dispersible in the binder. The overlayer can include a hydrolyzable moiety, such as a metal alkoxide.

The nanocrystal can be a member of a substantially monodisperse core population, such as a population exhibiting less than a 15% rms deviation in diameter of the nanocrystal, which can emit light in a spectral range of no greater than about 75 nm full width at half max (FWHM). The nanocrystal can photoluminesce with a quantum efficiency of at least 10% and can have a particle size in the range of about 15 Å to about 125 Å.

The binder can include an organic polymer or inorganic matrix.

The details of one or more embodiments are set forth in the accompanying drawings and the description below. Other features and advantages will be apparent from the description and drawings, and from the claims.

DETAILED DESCRIPTION

Figure 1:
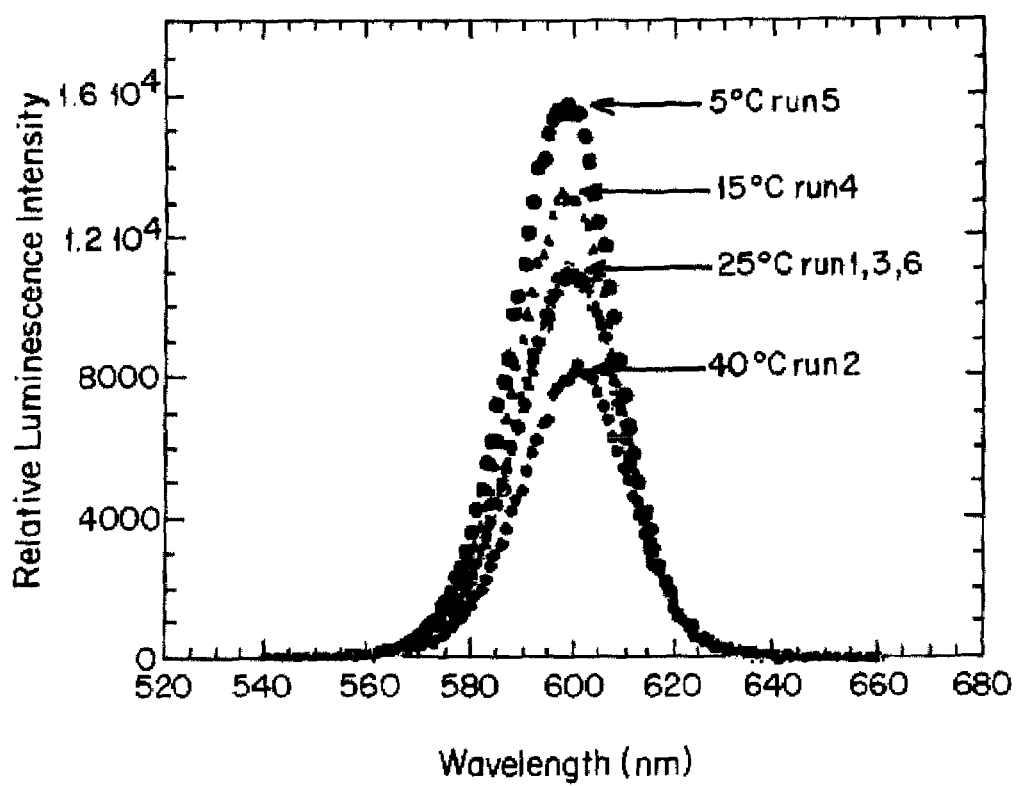
FIG. 1 is a graph depicting emission spectra of ZnS-capped CdSe nanocrystals in a poly(lauryl methacrylate) matrix irradiated at 480 nm at various temperatures.

A temperature-sensing composition can include a semiconductor nanocrystal. Nanocrystals composed of semiconductor material can be illuminated with a light source at an absorption wavelength to cause an emission at an emission wavelength, the emission having a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue (i.e., to higher energies) as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) can be observed. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The narrow emission band of the nanocrystal can improve the performance and reliability of the temperature-sensing composition relative to compositions that include conventional molecular probes that have broad, fixed wavelength emission bands. In addition, the excitation profile of the nanocrystal can be broad and intense, which can allow efficient excitation of the nanocrystals across a range of wavelengths in the visible spectrum. These factors together offer flexibility in the design of optical detection systems for temperature-sensing applications.

The nanocrystal can be chemically stable when illuminated. The nanocrystal can be relatively unreactive with other materials, which can permit it to be used as a temperature probe in a wide variety of environments. For example, the emission of the nanocrystal can be independent of gas pressure, such as oxygen pressure, or resistant to degradation in the presence of oxygen. Conventional organic temperature probes can degrade rapidly when illuminated, decreasing the useful lifespan of the coatings that contain them. A variety of applications can be envisioned for temperature-sensing compositions that contain nanocrystals on the well-defined temperature dependent emission properties of the nanocrystal. For example, in aerospace engineering, nanocrystal-based temperature indicators can be used as the active component in temperature sensitive paints or as an internal temperature calibrant for two-component pressure sensitive paints.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. No. 6,322,901, incorporated herein by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl)selenide ($(TMS)_2Se$), trialkyl phosphine selenides such as (tri-n-octylphosphine)selenide (TOPSe) or (tri-n-butylphosphine)selenide (TBPSe), trialkyl phosphine tellurides such as (tri-n-octylphosphine)telluride (TOPTe) or hexapropylphosphorustriamide telluride (HPPTTe), bis(trimethylsilyl)telluride ($(TMS)_2Te$), bis(trimethylsilyl)sulfide ($(TMS)_2S$), a trialkyl phosphine sulfide such as (tri-n-octylphosphine)sulfide (TOPS), an ammonium salt such as an ammonium halide (e.g., $NH_4Cl$), tris(trimethylsilyl)phosphide ($(TMS)_3P$), tris(trimethylsilyl)arsenide ($(TMS)_3As$), or tris(trimethylsilyl)antimonide ($(TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include tri-n-octyl phosphine (TOP) and tri-n-octyl phosphine oxide (TOPO). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 400 nm to 800 nm. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901, incorporated herein by reference in its entirety. By adjusting the temperature of the reaction mixture during overcoating and monitoring the absorption spectrum of the core, over coated materials having high emission quantum efficiencies and narrow size distributions can be obtained.

The particle size distribution can be further refined by size selective precipitation with a poor solvent for the nanocrystals, such as methanol/butanol as described in U.S. Pat. No. 6,322,901, incorporated herein by reference. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% RMS deviation from mean diameter, preferably 10% RMS deviation or less, and more preferably 5% RMS deviation or less.

Transmission electron microscopy (TEM) can provide information about the size, shape, and distribution of the nanocrystal population. Powder x-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from x-ray diffraction data using, for example, the Scherrer equation. It also can be estimated from the UV/Vis absorption spectrum.

The outer surface of the nanocrystal can include layer of compounds derived from the coordinating solvent used during the growth process. The surface can be modified by repeated exposure to an excess of a competing coordinating group to form an overlayer. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

The compound forming the overlayer can have a reactive group that can react with another compound to bond the nanocrystal to the binder. The binder can form a matrix. The matrix can be an organic polymer matrix, such as a polyacrylate matrix, or an inorganic matrix, such as a sol-gel-derived matrix.

The reactive group can be a polymerizable moiety, such as an acrylate moiety, a stryryl moiety, or a hydrolyzable moiety, for example, silicon alkoxide, titanium alkoxide, zirconium alkoxide, or other metal alkoxide, metal amide, metal carboxylate, or metal halide groups. The reactive groups can react with each other, or with reactive groups of other compounds or monomers, to form a solid matrix containing the nanocrystals. In this manner, the nanocrystal can be incorporated into a solid matrix formed in part by reaction of the reactive groups. Alternatively, the reactive group can be a functionality, such as an amino or hydroxyl group, that can react with a multifunctional component, such as a dicarboxylic acid, or reactive derivative thereof, or a diisocyanate, to form a solid matrix containing the nanocrystals.

The temperature-sensing composition can be applied to a substrate as a paint. The paint can include a binder and a deposition solvent. The binder can produce a film on a surface of an object upon evaporation of solvent. The binder can include an organic or inorganic polymer or prepolymer, for example, a polymer or prepolymer typically used in a paint composition. The binder can form a film by chemical reaction with atmospheric moisture, a heat or light induced reaction, a chemical interaction with other components within the paint, such as the nanocrystal overlayer, or combinations thereof. The binder can include a silicone polymer, for example, a thermoplastic silicone copolymer or dimethyl polysiloxane, a silicone co-polymers such as silicone-polyurethane or silicone-polyester co-polymers, an acrylate or urethane polymer or prepolymer, or a hydrolyzable composition including a silicon alkoxide, a titanium alkoxide, a zirconium alkoxide, an aluminum alkoxide, or other metal alkoxide that can form an inorganic matrix. The deposition solvent is a solvent that dissolves the nanocrystal and binder and can be sufficiently volatile to produce a smooth film. The deposition solvent can include 1,1,1-trichloroethane, dichloromethane, ethyl alcohol, butyl alcohol, isopropyl alcohol, cyclohexane, or mixtures thereof.

The paint can be applied to a substrate to form a film. A white substrate can improve the performance of the sensor by reflecting the emitted light more completely. The film can be thin, for example, 1-100, 2-50, 3-20, or 5-10 microns in thickness. Film thickness can be determined using an ultraviolet/visible spectrometer by measuring the optical absorption of the nanocrystal and applying Beer's law. The nanocrystal can be uniformly distributed in the film. The coated surface can be irradiated with the excitation wavelength. While the coated object is irradiated, the emission wavelength can be monitored, for example, with a photomultiplier tube. The intensity of the emission can be compared with predetermined calibration values to produce measurements of the temperature on the surface. By distributing nanocrystals over a surface and monitoring emission at particular regions on the surface, a quantitative map of temperature on the surface can be obtained.

The temperature-sensing composition can be used in the preparation of pressure sensitive paints, such as those described in Gouterman et al., U.S. Pat. No. 5,186,046, incorporated by reference in its entirety. The pressure sensitive paint includes a pressure-sensing composition that produces an emission that is dependent on pressure. Any temperature dependence can be corrected by including the temperature-sensing composition in the pressure sensitive paint. A pressure-sensing composition can include a porphyrin, such as a platinum porphyrin, in particular, platinum octaethylporphyrin. For porphyrins, the individual molecules should be separated by at least about 50 Å to prevent triplet-triplet deactivation. This intermolecular separation corresponds to a porphyrin concentration of about $10^{-2}$ molar. The excitation spectrum for platinum octaethylporphyrin displays a strong excitation band in the near ultraviolet region of the visible spectrum at approximately 380 nm and a weaker band in the green region at approximately 540 nm and an emission in the red region of the visible spectrum at approximately 650 nm. Platinum octaethylporphyrin has an emission quantum yield of approximately 90%.

In a pressure sensitive paint, either the excitation wavelength or the emission wavelength of the pressure-sensing composition and the temperature-sensing composition are different. When a common excitation wavelength is present, the emission wavelength maxima can be separated by 10 nm or more, or 20 nm or more, so that the data for each composition can be measured separately. One advantage of a temperature-sensing composition including a nanocrystal is that the emission wavelength of the nanocrystal can be selected so that the emission does not interfere with the emission from the pressure-sensing composition. The excitation wavelength can be selected so that the nanocrystal and the pressure-sensing composition are excited at the same wavelength.

When different emission wavelengths are generated, the intensities can be measured by rotating different interference filters in front of a detection device, such as a video camera, or a photomultiplier tube, during irradiation with the excitation wavelength. Alternatively, a diode array detector can be used to monitor emissions.

EXAMPLES

Semiconductor nanocrystals were shown to be emissive temperature probes in solution and in polymer matrices Highly emissive nanocrystals of cadmium selenide (CdSe) were synthesized by colloidal growth, such as, for example, the method described in U.S. Pat. No. 6,322,901, incorporated herein by reference in its entirety. The CdSe nanocrystals were overcoated with zinc sulfide (ZnS). Semiconductor nanocrystals with average diameters in the range 4 to 5 nm were size selected by precipitation, reducing the distribution of sizes about the average diameter. The size-selected nanocrystals provide indicators with an emission maximum at 600 nm at ambient temperature. The absorption profile of the size-selected ZnS-capped CdSe nanocrystals was intense, having an onset of absorbance that began at approximately 600 nm and extended into the ultraviolet spectral region.

The nanocrystals are well-suited for use as luminescent temperature probes. ZnS-capped CdSe nanocrystals dispersed in a poly(lauryl methacrylate) polymer matrix provided a material for optical measurements. A polymer rod containing nanocrystals was prepared by redispersing synthesized nanocrystals into laurylmethacrylate monomer containing TOP (5% v/v). Then, ethyleneglycol dimethacrylate crosslinker was added to the nanocrystal-monomer solution with 1:4 volume ratio of cross-linker to monomer. After azobisisobutyronitrile radical initiator (<1% (w/w)) was added, the final solution was transferred to a 60 mm×5 mm (length× diameter) glass tube and polymerized in an oven at 70-75° C. for 2 hours. The high-clarity nanocrystal-polymer composite rod was then removed from the glass mold.

A thin disk of the polymer-supported nanocrystals was cut from the rod with a single edge razor blade. The disk had a diameter of 5 mm and a thickness of approximately 1 mm. The disk was mounted flat on a surface of a temperature-controlled stage using thermal grease (CRY-CON thermal conductive grease available from Lake Shore Cryotonics). The stage was a flat surface temperature controlled with a water bath. Temperatures were maintained within ±0.5 per degree Centigrade. The disk was irradiated with monochromatic blue-green light having a wavelength of 480 nm. The emission intensity of the nanocrystals in the disk was measured at various temperatures. The temperature dependent emission spectrum of the polymer-supported nanocrystals was measured using a steady-state emission spectrophotometer. The flat disk of nanocrystals mounted on a thermostatically controlled black flat plate was orientated at a 45° angle to an incident monochromatic excitation beam. Monochromatic excitation was achieved using a 200 W Hg—Xe arc lamp equipped with a Spex Model 1680B monochromator and a chopper. The emitted light intensity was measured normal to the incident excitation beam using a dry-ice cooled photomultiplier tube (Hamamatsu Type R943-02) after dispersal with a Spex Model 1870B monochromator. The background spectrum was subtracted using a Stanford Scientific Instruments photon counter. Specifically, the temperature of the stage was varied from 25 to 40, 40 to 25, 25 to 15, 15 to 5, and 5 to 25 degrees centigrade. FIG. 1 depicts the emission intensity of the disk at each temperature.

Figure 2:
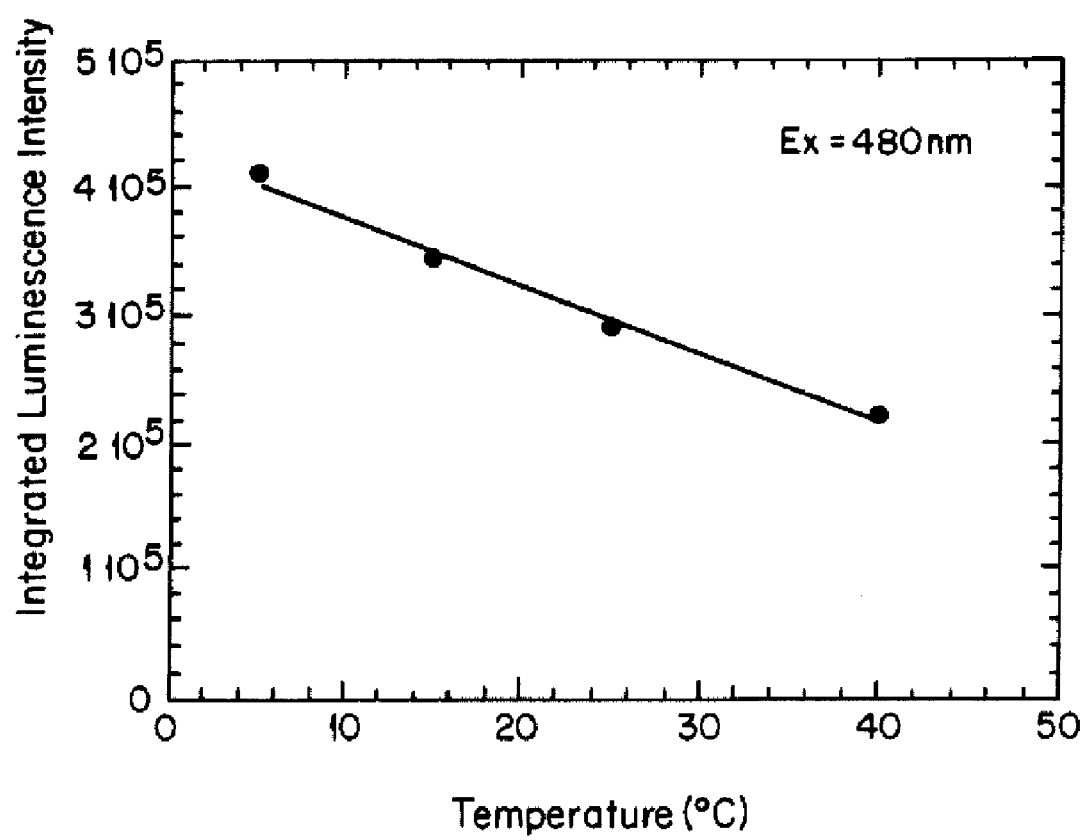
FIG. 2 is a graph depicting integrated emission intensity of the ZnS-capped CdSe nanocrystals dispersed in a matrix over a range of temperatures.

The decrease in emission intensity with temperature is linear. As depicted in FIG. 2, the change in emission intensity was 1.3% per degree centigrade. The temperature dependence of the emission intensity is not dependent on the characteristics of the sample to any great degree. The slope of the temperature dependent emission intensity does not vary greatly from sample to sample. Generally, the slope varies from 1.1 to 1.6% per degree centigrade. The emission intensity also can be independent of excitation wavelength in the visible spectrum and is not dependent on the initial quantum yield of the sample or the supporting matrix. Furthermore, the change in emission intensity with temperature is fully reversible as indicated by the superposition of spectra obtained at 25 degrees centigrade at the beginning, middle, and end of the experiment after heating and cooling the disk. There is no hysterisis, which could indicate decomposition of the nanocrystals. Similar effects have been noted for nanocrystals dispersed in other matrices. For example, the nanocrystals can be dispersed in a sol-gel matrix. 40-50 mg of CdSe nanocrystal, either overcoated with ZnS or bare, which were washed repeatedly to remove any excess TOPO cap, are pumped dry under a vacuum and transferred into an inert atmosphere glove box. The nanocrystals were then redissolved in a solvent mixture consisting of 150 mg of tetrahydrofuran, 600 mg ethyl alcohol and 60 mg of tris-hydroxylpropyl phosphine. After stirring this solution for 10 minutes at approximately 50° C., 60-70 mg of tetrabutoxy (IV) titanate was added dropwise to this solution. The solution was then further stirred for 3 hours under the inert nitrogen atmosphere of the glove box. The films were finally prepared by spin-coating a freshly filtered nanocrystal precursor solution onto freshly cleaned microscope slides for 1 minute and then annealing for 2 minutes at 160-200° C. The spinning speed was between 3000 and 7500 rpm and decided by the desired thickness of the film. Thicker films were generated at slower spin speeds. It is necessary to eliminate exposure of the precursor solution to water prior to spin-coating, hence all the solvents used were anhydrous and the solution was allowed to pre-polymerize in the glove box.

In another example, a dispersion of nanocrystals in a binder of Dow C734, a silicone polymer was prepared. The CdSe nanocrystals were dissolved in dichloromethane at a concentration of at least 1 mM to form a nanocrystal solution. A 5:1 or 10:1 ratio of the nanocrystal solution to binder was combined and thoroughly mixed until uniform. The binder-nanocrystal solution was deposited on a glass slide or a quartz slide to form a film. Various concentrations of nanocrystal in binder were prepared such that color of the films ranged from white (low concentration of nanocrystals, ~0.1 mM) to pale in color as determined by naked eye in room light. The films were excited using with monochromatic blue-green light having a wavelength of 480 nm. The lower concentration films produced emission that were very difficult to detect by eye, but could be easily seen with a photomultiplier tube detector. Emission from the more concentrated films was visible by eye. The emission from the higher concentration films could also be observed by eye using a hand held Hg lamp for excitation. The maximum wavelength of emission and band width of the emission are similar for nanocrystals in binder and nanocrystals in solution.

Other embodiments are within the scope of the following claims.

What is claimed is:

1. A method of making a composite, comprising:
   providing a semiconductor nanocrystal including a first compound on an outer surface of the nanocrystal, wherein the first compound includes a reactive moiety;
   reacting the first compound with a second compound to form a matrix;
   dispersing the semiconductor nanocrystal and the second compound in a solvent, thereby forming a paint; and
   applying the paint directly to a first surface of a substrate to directly form a film that is 1-100 microns in thickness, on the first surface of the substrate.

2. The method of claim 1, wherein the reactive moiety includes a silicon alkoxide, a titanium alkoxide, or a zirconium alkoxide.

3. The method of claim 1, wherein the reactive moiety includes an organic moiety or an organometallic moiety, and the reactive moiety is incorporated into the matrix.

4. The method of claim 1, wherein the semiconductor nanocrystal includes a Group II-VI compound, a Group III-V compound or a Group IV compound.

5. The method of claim 1, wherein the second compound comprises an organic polymer.

6. The method of claim 1, wherein the film is 2-50 microns in thickness.

7. The method of claim 1, wherein the film is 3-20 microns in thickness.

8. The method of claim 1, wherein the film is 5-10 microns in thickness.

9. The method of claim 1, wherein the paint is applied to a single surface.

10. The method of claim 1, wherein the reactive moiety is a polymerizable moiety.

11. The method of claim 10, wherein the polymerizable moiety is an acrylate moiety or a styryl moiety, or a hydrolyzable moiety.

12. The method of claim 11, wherein the hydrolyzable moiety is a metal alkoxide, a metal amide, a metal carboxylate, or a metal halide.

13. The method of claim 1, wherein the semiconductor nanocrystal includes a first semiconductor material selected from ZnS, ZnSe, ZnTe, CdS, CdSe, CdTe, HgS, HgTe, AlN, AlP, AlAs, AlSb, GaN, GaP, GaSb, InN, InP, InSb, TlN, TlP, TlSb and mixtures thereof.

14. The method of claim 13, wherein the semiconductor nanocrystal includes an overcoating including a second semiconductor material.

15. The method of claim 14, wherein the second semiconductor material is selected from ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, and mixtures thereof.

* * * * *